United States Patent [19]

Jargiello et al.

[11] Patent Number: 5,021,324

[45] Date of Patent: Jun. 4, 1991

[54] PRINTING PLATE PROTECTANT

[75] Inventors: Paul A. Jargiello, Livingston; Thomas J. Dooley, Teaneck, both of N.J.

[73] Assignee: Polychrome Corporation, Yonkers, N.Y.

[21] Appl. No.: 593,131

[22] Filed: Oct. 5, 1990

[51] Int. Cl.$^5$ .............................................. G03C 5/00
[52] U.S. Cl. ................................... 430/331; 430/309; 430/330; 430/432; 562/21
[58] Field of Search ............... 430/309, 325, 330, 331, 430/432; 562/21

[56] References Cited

U.S. PATENT DOCUMENTS

| | | | |
|---|---|---|---|
| 3,202,579 | 8/1965 | Berth et al. | 562/21 |
| 3,214,454 | 10/1965 | Blaser et al. | 562/21 |
| 3,914,162 | 10/1975 | Kowalski | 562/21 |
| 4,322,492 | 3/1982 | Kunitz et al. | 430/435 |
| 4,330,616 | 5/1982 | Kurematsu et al. | 430/434 |
| 4,786,581 | 11/1988 | Stahlhofen et al. | 430/331 |
| 4,968,584 | 11/1990 | Nagashima et al. | 430/331 |

Primary Examiner—Hoa Van Le
Attorney, Agent, or Firm—Jack Matalon

[57] ABSTRACT

A composition useful for the protection of actinic light-exposed presensitized lithographic printing plates. The composition contains an effective amount of the dipotassium salt of hydroxyethylidene diphosphonic acid dissolved in water. The composition is applied to the surface of the revealed substrate of the plates after they have been developed but before treatment to heat, to prevent surface contamination from the heat treatment.

20 Claims, No Drawings

PRINTING PLATE PROTECTANT

FIELD OF THE INVENTION

This invention relates to a printing plate protectant composition comprising an effective amount of the di-potassium salt of hydroxyethylidene diphosphonic acid dissolved in water. The composition is useful for protecting the surface of actinic light-exposed presensitized lithographic printing plates, when applied to the surface of the revealed surface of the plates after they have been developed but before treatment to heat, thereby preventing surface contamination resulting from the heat treatment.

BACKGROUND OF THE INVENTION

Radiation-sensitive plates suitable for lithographic printing are well known. Such plates typically consist of a substrate such as aluminum that may be grained and/or anodized, or of zinc, magnesium, copper or steel or a combination such as a bimetal or laminate, and a layer of radiation-sensitive material deposited on the substrate.

Image-wise exposing the radiation-sensitive layer to actinic radiation through a transparency causes the solubility of the radiation-exposed areas to change relative to that of the unexposed areas. Upon treatment of the exposed plate with a suitable developer, the more soluble areas can be readily removed to reveal the underlying substrate and leave an image on the substrate constituted by the less soluble areas. The areas of the substrate revealed upon development constitute the non-image areas.

A type of radiation-sensitive materials known as photopolymers become less soluble after exposure to radiation and therefore a negative transparency is used in the exposure. In this case, it is the non-radiation-exposed areas that are removed upon development and the radiation-exposed areas that remain on the substrate form the image. Examples of suitable photopolymers include diazo resins, chromium-sensitized colloids, diazonium or azide-sensitized resins or polymers bearing such groups. Plates having a radiation-sensitive layer based on such materials are known as negative-working plates.

Radiation-sensitive materials such as those based on orthoquinone diazides become more soluble after exposure to radiation and therefore a positive transparency is used in the exposure. In this case, it is the radiation-exposed areas that are removed by development and the non-radiation-exposed areas that remain on the substrate form the image. Plates having such radiation-sensitive layers are known as positive-working plates.

The life, in terms of the number of copies it can produce, of a printing plate can often be increased by ("burning-in") the image areas, provided, of course, that the material of the image areas is suitable. "Burning-in" is a well-established practice in the art of producing lithographic printing plates from radiation-sensitive plates. The "burning-in" causes extensive crosslinking to occur in the polymeric structure of the material comprising the image area. The limiting temperature and time of the "burning-in" is that at which the aluminum anneals, resulting in a loss of strength required for a printing plate.

U.K. Patent 669,412 discloses the burning-in of images based on naphthoquinone diazides. In accordance with the teachings of this patent, a radiation-sensitive plate including a layer of the diazide is image-wise exposed, developed with an alkaline solution to remove selectively those areas of the layer exposed to radiation, and then placed in an oven to heat the image constituted by those areas of the layer that were not exposed to radiation. Thereafter, it is necessary to treat the plate with an alkaline solution again in order to remove contaminating residues from the plate and make the plate ready for printing.

In many cases, the image areas to be heated may be reinforced by incorporating reinforcing material in the radiation sensitive layer and/or by applying the reinforcing material in the form of a reinforcing lacquer to the image areas after development. Novolak resins and/or resol resins are examples of commonly used reinforcing materials. However, as disclosed in U.K. Patent 1,154,749, heating at a temperature sufficient to harden resin-reinforced image areas causes those areas of the substrate revealed on development to be at least partially covered with a contaminating layer which is ink accepting and which would therefore cause scumming and yield a soiled background during printing. This layer must therefore be removed before printing is initiated and this is achieved in accordance with the teachings of the patent by treating the plate with aqueous alkaline solution.

U.S. Pat. No. 4,294,910 discloses the use of various aqueous compositions known as "gumming" or "prebake" solutions to avoid problems resulting from the burning-in process. Such solutions contain materials such as sodium dodecyl phenoxy benzene disulphonate, alkylated naphthalene sulphonic acid, sulphonated alkyl diphenyl oxide, methylene dinaphthalene sulphonic acid, etc.

U.S. Pat. No. 4,786,581 discloses the use of "gumming" solutions for protecting plates during the burning-in process; these aqueous solutions contain a hydrophilic polymer component and an organic acid component. The organic acid component (or water-soluble salt thereof) contains di- or greater acid functionality and encompasses the benzene carboxylic acids, sulphonic acids and phosphonic acids including alkane phosphonic acids. In contradistinction to the materials recited in the '581 patent, the present invention does not require the use of a hydrophilic polymer. Furthermore, the diphosphonic acid (present as the di-potassium salt) employed in the present invention provides superior results in protecting the surface of aluminum plates to be burned-in. Such superior protectant properties would be related to the ability of the di-potassium salt of the hydroxyethylidene diphosphonic acid to complex with the aluminum oxide surface of the printing plate, whereas the alkane phosphonic acids disclosed in the '581 patent do not possess such a property.

The contaminating layer produced as the result of the burning-in process is not, as a rule, discernible to the naked eye and it is difficult to ensure that all the contamination has been removed. Moreover, in the case of those substrate surfaces that are porous, as is the case of an anodized aluminum plate, contamination may be present in the pores. Such contamination is likely to cause scumming during long printing runs as the substrate surface is gradually worn away. The alternative of redeveloping the plates after burning-in in order to remove the contaminating layer is costly and inconvenient since the plates have to be returned to the plate fabrication facility after they have been removed from the oven.

In view of the difficulties associated with the removal of the contamination which is produced by the burning-in procedure, it is desirable to prevent such contamination from occurring in the first instance. It has been found that the contamination apparently arises as a result of some component of the image material subliming from the image areas during heating and subsequently being redeposited on the areas of the substrate revealed on development. Even plates that contain no substances that could generate contamination during heating nevertheless become contaminated by deposition of contaminating material previously deposited on the internal surfaces of the burning-in oven as a result of prior usage.

DETAILS OF THE PRESENT INVENTION

The present invention involves the use of an aqueous composition which is applied to the surface of the developed plate prior to burning-in. The composition acts as a protectant in preventing contamination from occurring during burning-in and thereby obviates the necessity for redeveloping the plate. The potassium salt form of the hydroxyethylidene diphosphonic acid is utilized since other cationic forms of this acid (e.g. the sodium salt form) are not sufficiently soluble to provide the desired concentration in water. Generally, the di-potassium salt of hydroxyethylidene diphosphonic acid will be present in the solution in a concentration of 1 to 20 wt. %, preferably 2 to 10 wt. %.

The pH of the aqueous composition containing the di-potassium salt is generally in the range of 4 to 7, preferably 5 to 6. At a pH of about 5.5, the tri-potassium salt form of the acid commences being formed in the solution, and the concentration of the tri-potassium salt form increases to a maximum as the pH is raised. For the purposes of this invention, the tri-potassium salt form may be present in an amount of 0 to 15 wt. %, preferably 0 to 5 wt. %.

Preferably, the composition also includes a salt which is selected from the group consisting of stannous salts, zinc salts and mixtures thereof. The preferred salts are the halides such as the chlorides and mixtures of the stannous and zinc salts are particularly preferred. The content of these salts may be 1 to 7 wt. %, preferably 1 to 3 wt. %. When a mixture of the salts is employed, the ratio of stannous salt to zinc salt may be in the range of 12:1 to 0.2:1, preferably 3:1 to 1:1, parts by weight.

The composition desirably also includes an anionic surfactant that contains functionalities of a salt of a strong organic acid and a salt of a weak organic acid. The surfactant may be present in an amount of 3 to 11 wt. %, preferably 5 to 9 wt. %. Examples of suitable surfactants of anionic and other types include tetrasodium N-(1,2-dicarboxyethyl)-N- octadecyl sulfosuccinamate (which is preferred), the tetrapotassium salt form of the foregoing, disodium cocoamphocarboxypropionate, sodium cocoamphopropylsulfonate, sodium cocoamphoglycinate, alkyl (50% $C_{14}$, 40% $C_{12}$, 10% $C_{16}$) dimethylbenzyl-ammonium chloride, sodium N-methyl-N-cocoyltaurate, modified soya dimethylethylammonium ethosulfate, cocamidopropylhydroxysultaine, disodium dicarboxyethyl phosphoethylimidazoline, and the like.

It is also desirable to include a salt of citric acid, e.g. di-potassium citrate and/or tri-potassium citrate in the aqueous composition in an amount of 1 to 9 wt. %, preferably 2 to 6 wt. %.

The aqueous composition desirably also contains one or more polyhydroxy compounds containing 3 to 10 carbon compounds; preferred examples of the polyhydroxy compounds include sorbitol and glycerol and mixtures thereof. Sorbitol may be present in amounts of 1 to 15 wt. %, preferably 3 to 7 wt. %, while glycerol may be present in amounts of up to about 3 wt. %, preferably 0.1 to 1.0 wt. %; where sorbitol and glycerol are both present, the ratio of sorbitol to glycerol will be in the range of 0.3:1 to 150:1, preferably 3.5:1 to 70.1. The use of the polyhydroxy compound permits the quantity of the surfactant to be drastically reduced, i.e. to 0.04 to 8.0 wt. %, preferably 0.08 to 0.8 wt. %.

The components of the aqueous composition should be such that they do not volatilize at the burning-in temperature, and are selected according to the nature of the substrate, radiation-sensitive layer, and the purpose for which the plate is to be used. For example, in the case where a lithographic printing plate is being produced, the selected component must not only be an effective physical barrier, but it must also be such that it does not deleteriously affect the image (e.g. by dissolving it or by rendering it non-ink receptive). Further, it must be readily removable after the burning-in process without the image and non-image areas being adversely affected.

The foregoing examples of components are particularly useful in protecting lithographic printing plates from contamination occurring as a result of the burning-in process. The compositions of the present invention are easily applied to the surface of the developed plate by conventional methods, e.g. spraying, dipping, brushing, etc. and provide the desired protective shield. After burning-in has been completed, the shield can be readily removed from the plate merely by wiping the plate with water. This removal step can be effected while the plate is actually mounted on the printing press, and thus the plate need not be returned to the plate-making facility after completion of the burning-in procedure. Rinsing with water to remove the shield and desensitizing with, e.g. gum arabic, is all that is then required to make the plate ready for printing.

The aqueous compositions of the present invention are also quite versatile in that they may also be employed as preparation and storage gums where the burning-in process is not desired. When used as a preparation gum, the composition is coated onto the plate after development; the composition acts to improve the hydrophilic properties of the aluminum oxide-coated base. When used as a storage gum, the composition is coated onto the developed plate, and the thus-coated plate may be stored for extended periods of time, since the adsorbent aluminum oxide surface is protected from contamination. Even after prolonged storage, the plates may be taken directly to the press and they produce good copies without any further preparation.

The following examples serve to illustrate the invention (unless otherwise indicated, all percentages are by weight):

EXAMPLE 1

Using agitation, 527 g 87.1% potassium hydroxide were dissolved in 3 kg deionized water. After cooling, 1.301 kg of a 60% solution of 1-hydroxyethylidene-1,1-diphosphonic acid were added and rinsed in with 192 g deionized water. Thereafter 76 g anhydrous stannous chloride were added and, after dissolution, 45 g anhydrous zinc chloride were added. The solution was cooled and thereafter a solution of 95 g 87.1% potassium hydroxide in 250 g deionized water was added and rinsed in with 25 g deionized water. To the resultant mixture were added 44 g 30% hydrogen peroxide and rinsed in with 25 g deionized water. Subsequently, a solution of 239 g 87.1% potassium hydroxide in 775 g deionized water was added and, with cooling, 310 g citric acid monohydrate. Afterwards, 2.233 kg of a 35% solution of tetrasodium N-(1,2-dicarboxyethyl)-N-octadecyl succinamate were added and rinsed in with 500 g deionized water. Finally, the concentration was adjusted by the addition of 2 kg deionized water and the solution was filtered. The resultant solution had a solids content of 22.2% and had a pH of 5.9.

EXAMPLE 2

Using agitation, 527 g 87.1% potassium hydroxide were dissolved in 3 kg of deionized water. After cooling, 1.301 kg 1-hydroxyethylidene-1,1-diphosphonic acid (60% solution) were added and rinsed in with 192 g deionized water. To this solution, 76 g anhydrous stannous chloride were added and, after dissolution. 45 g anhydrous zinc chloride. The solution was cooled and thereafter a solution of 95 g 87.1% potassium hydroxide in 250 g deionized water were added and rinsed in with 25 g deionized water. To the solution were added 44 g 30% hydrogen peroxide, rinsing in with 25 g deionized water. Subsequently, 1.485 kg of the succinamate of example 1 were added and rinsed in with 245 g deionized water. The concentration was adjusted with 1.430 kg deionized water, and the solution was filtered, thereby resulting in a final solution containing 21.4% solids and having a pH of 5.8.

EXAMPLE 3

Using agitation, 4.047 kg 87.1% aqueous potassium hydroxide were dissolved in 30 kg deionized water. After cooling, 9.949 kg of a 60% solution of 1-hydroxyethylidene-1,1-diphosphonic acid were added and rinsed in with 1.0 kg deionized water. Thereafter, 1.159 kg anhydrous stannous chloride were added, and after complete dissolution, 821 g 87.1% potassium hydroxide in 2.753 kg deionized water added and rinsed in with 50 g deionized water. To this solution were added 5.973 kg 70% sorbitol and 500 g of deionized water as a rinse. In addition, 335 g 99% glycerol in 500 g deionized water were rinsed in with 500 g deionized water. Subsequently, 70 g of an 80% solution of $C_{14}$-$C_{16}$ alkyl dimethylbenzyl ammonium chloride dissolved in 300 g deionized water were added and rinsed in with 200 g deionized water. Finally, the concentration was adjusted with 1.24 kg deionized water, resulting in a solution containing 21.3% solids and having a pH of 5.6.

EXAMPLE 4

Using agitation, 628 g 87.1% aqueous potassium hydroxide were dissolved in 5 kg deionized water. To this solution were added 1.558 kg 1-hydroxyethylidene-1,1-diphosphonic acid (60% solution) and an additional 160 g deionized water for rinse purposes. The solution was cooled and 532 g 70% sorbitol were added, followed by a solution of 56 g glycerol in 58 g deionized water, using a total of 200 g deionized water to rinse in the components. Thereafter, 11 g of a solution of 80% of $C_{14}$-$C_{16}$ alkyl dimethylbenzyl ammonium chloride in 100 g deionized water was added and rinsed in with 90 g deionized water. Finally, the solution was diluted with 355 g deionized water to result in a solution containing 20.3% solids and having a pH of 5.4.

EXAMPLE 5

Positive working plates were hand developed in the usual manner. Subsequent to development, and while still damp, the plates were treated with the solutions of each of Examples 1–4, except for the control plate which was not treated, by applying a few milliliters of solution to the plate surface, followed by rubbing-in with a cloth. The wet plates were then buffed to near dryness and then air dried. Based upon the weight gain, it was determined that the weight of solution that was applied to the plate surface was $4.0\pm0.5$ g/m$^2$. The plates were then baked in an oven (Wisconsin: type SPC-II30) having a conveyor belt, convection heat and forced air, at the temperatures and for the periods of time indicated in Table I below. The baked plates were then washed down with water and then examined. This first examination was for the purpose of determining whether there was any burning-through or penetration to the base of the plate to produce pinholes, the plate surface was also examined to determine whether there was any residue thereon. The plates were then inked by rubbing their surfaces with a cloth containing ink and water and again examined. This second examination was conducted to determine whether there was any ink take-up by the base in the exposed areas of the plate, the preciseness of inking of the image. (i.e. no ink build-up or loss of fine detail) and correctness of inking of the unexposed areas of the test pattern (i.e. the oleophilicity of the plate surface should not have been affected by the baking step).

TABLE I

| Solution | 232° C. 3.5 min. | 246° C. 3.5 min. | 260° C. 2.5 min. | 260° C. 3.5 min. | 274° C. 1.5 min. | 274° C. 3.5 min. | 288° C. 1.5 min. | 288° C. 3.0 min. |
| --- | --- | --- | --- | --- | --- | --- | --- | --- |
| Ex 1 | Pass | Pass | Pass | Pass | Pass | Pass | Pass | Pass |
| Ex 2 | Pass | Pass | Pass | Pass | Pass | Pass | Pass | Pass |
| Ex 3 | Pass | Pass | Pass | Pass | Pass | Pass | Pass | Pass |
| Ex 4 | Pass | Pass | Pass | Pass | Fail | Fail | Fail | Fail |
| Control | Fail | Fail | Fail | Fail | Fail | Fail | Fail | Fail |

The results set forth in Table I above show that the solutions of Examples 1 to 4 provide excellent protection against the effects of baking. In particular, it is noted that the control (i.e. the plates that were not treated prior to baking) failed the second examination after the plates were baked at the indicated temperatures and periods of time. In contrast thereto, the plates treated with the solutions of Examples 1 to 4 passed both examinations after baking at all the indicated temperatures and periods of time. The plates treated with the solution of Example 4 failed only at the higher temperatures, thus indicating the desirability of incorporating a stannous salt (Example 3) or a mixture of a stannous salt and a zinc salt (Examples 1 and 2).

What is claimed is:

1. An aqueous composition useful for the protection of actinic light-exposed presensitized lithographic printing plates, when applied to the surface of the revealed substrate of said plates after they have been developed but before treatment to heat, to prevent surface contamination from said heat treatment, which comprises an effective amount of the di-potassium salt of hydroxyethylidene diphosphonic acid dissolved in water.

2. The composition of claim 1 wherein the di-potassium salt of hydroxyethylidene diphosphonic acid is present in an amount of 1 to 20 wt. %.

3. The composition of claim 1 including the tri-potassium salt form of the acid.

4. The composition of claim 3 wherein the tri-potassium salt form of the acid is present in an amount of 0 to 5 wt. %.

5. The composition of claim 1 including a salt selected from the group consisting of stannous salts, zinc salts and mixtures thereof.

6. The composition of claim 5 wherein the salt is present in an amount of 1 to 7 wt. %.

7. The composition of claim 5 wherein the salt comprises a mixture of a stannous halide and a zinc halide.

8. The composition of claim 7 wherein the stannous halide to zinc halide ratio is in the range of 12:1 to 0.2:1.

9. The composition of claim 1 including an anionic surfactant that contains functionalities of a salt of a strong organic acid and a salt of a weak organic acid.

10. The composition of claim 9 wherein the surfactant is present in an amount of 3 to 11 wt. %.

11. The composition of claim 9 wherein the surfactant comprises tetrasodium N-(1,2-dicarboxyethyl)-N-octadecyl sulfosuccinamate.

12. The composition of claim 1 including a salt of citric acid.

13. The composition of claim 12 wherein the salt is present in an amount of 1 to 9 wt. %.

14. The composition of claim 12 wherein the salt comprises di-potassium citrate and/or tri-potassium citrate.

15. The composition of claim 1 including a polyhydroxy compound containing 3 to 10 carbon atoms.

16. The composition of claim 15 wherein the polyhydroxy compound is selected from the group consisting of sorbitol, glycerol and mixtures thereof.

17. The composition of claim 16 wherein the sorbitol is present in an amount of 3 to 7 wt. %, the glycerol is present in an amount of 0 to 3 wt. %, and the ratio of sorbitol to glycerol is in the range of 0.3:1 to 150:1.

18. The composition of claim 15 including an anionic surfactant that contains functionalities of a salt of a strong organic acid and a salt of a weak organic acid.

19. The composition of claim 18 wherein the surfactant is present in an amount of 0.04 to 8 wt. %.

20. The composition of claim 18 wherein the surfactant comprises tetrasodium N-(1,2-dicarboxyethyl)-N-octadecyl sulfosuccinamate.

* * * * *